United States Patent
Yamamoto

(12) 
(10) Patent No.: US 6,265,933 B1
(45) Date of Patent: Jul. 24, 2001

(54) FM DEMODULATOR

(75) Inventor: Yuji Yamamoto, Kawagoe (JP)

(73) Assignee: Pioneer Corporation, Tokyo-to (JP)

( * ) Notice: Subject to any disclaimer, the term of this patent is extended or adjusted under 35 U.S.C. 154(b) by 0 days.

(21) Appl. No.: 09/589,157

(22) Filed: Jun. 8, 2000

(30) Foreign Application Priority Data

Jun. 11, 1999 (JP) .................................................. 11-165415

(51) Int. Cl.$^7$ ...................................................... H03D 3/00

(52) U.S. Cl. .......................... 329/341; 329/315; 455/214; 455/337

(58) Field of Search ..................................... 329/315, 341, 329/342, 343; 455/205, 214, 337

(56) References Cited

U.S. PATENT DOCUMENTS

| | | | |
|---|---|---|---|
| 4,620,160 | * 10/1986 | Waggener | 329/104 |
| 4,906,942 | * 3/1990 | Nakai et al. | 329/318 |
| 5,293,247 | * 3/1994 | Ganse | 358/328 |
| 5,481,368 | * 1/1996 | Ozaki | 358/336 |
| 5,694,079 | * 12/1997 | Allpress et al. | 329/327 |

* cited by examiner

*Primary Examiner*—David Mis
(74) *Attorney, Agent, or Firm*—Nixon & Vanderhye

(57) ABSTRACT

The above object of the present invention can be achieved by an FM demodulator, into which an FM signal is inputted, for demodulating the inputted FM signal and outputting a digital FM demodulated signal. The FM demodulator is provided with: a limiter amplifier (3) for amplifying and converting the inputted FM signal to a rectangular wave having a predetermined amplitude; a reference signal generator (1) for generating a reference signal, which is a sine wave having a constant frequency; an A/D convertor (2) for sampling the reference signal outputted from the reference signal generator by the rectangular wave outputted from the limiter amplifier to thereby output a digital signal; an orthogonalizing device (4) for converting the digital signal outputted from the A/D convertor to two signals orthogonal to each other; an arctangent operator (5) for calculating an arctangent value on the basis of a ratio of the two signals outputted from the orthogonalizing device; and a differentiation operator (6) for calculating a differentiation of the arctangent value outputted from the arctangent operator, to thereby output the differentiation as the digital FM modulated signal.

2 Claims, 2 Drawing Sheets

FM DEMODULATOR

BACKGROUND OF THE INVENTION

1. Field of the Invention

The present invention generally relates to an FM (Frequency Modulation) demodulator, and more particularly to an arctangent type FM demodulator using a digital signal processing technique.

2. Description of the Related Art

A digital signal processing technique is applied to a construction of an FM demodulator, so as to realize a miniaturization and a high reliability of the apparatus. As an FM demodulator using such a digital signal processing technique, there is an arctangent type FM demodulator.

In the arctangent type FM demodulator, an AGC (Automatic Gain Control) circuit is equipped at an input stage thereof. An FM signal is inputted to this AGC circuit from a tuner or the like. The AGC circuit performs a variable-controls of the gain to amplify the FM signal in an analog form so that the FM signal has a constant amplitude. Namely, the function of the AGC circuit is to remove the amplitude fluctuation included in the FM signal. Then, the FM signal outputted from the AGC circuit is inputted to an A/D (Analog to Digital) convertor. The A/D convertor samples the FM signal, in which the amplitude level is made constant by the AGC circuit, and converts it into a digital signal. A sampling pulse generator supplies a sampling pulse to the A/D convertor.

When the digital signal corresponding to the FM signal is obtained in this manner, the processes after that is mainly performed by using the digital signal processing technique, so as to generate a digital FM demodulated signal, which corresponds to the FM signal in the analog form, through an arctangent operator and a differentiator for performing a predetermined digital signal process for example.

In this arctangent type FM demodulator, if the AGC circuit is not equipped at the input or prior stage of the A/D convertor, since the amplitude of the FM carrier wave received at a tuner etc., drastically changes depending upon the receiving condition, the value of the digital signal outputted from the A/D convertor drastically changes. Then, an error is generated in the arctangent operator or the differentiator for performing the predetermined digital signal process at the later stage of the A/D convertor. This results in a difficulty in obtaining a digital FM demodulated signal in a good condition.

In this manner, in the arctangent type FM demodulator, it is necessary to equip the AGC circuit at the input or prior stage of the A/D convertor.

However, the AGC circuit has a rather complicated structure and is rather expensive and brings about a complexity and a high cost of the apparatus as a whole, which is a problem.

SUMMARY OF THE INVENTION

It is therefore an object of the present invention to provide an arctangent type FM demodulator, which can avoid a complexity and a high cost and can sufficiently get a merit of the digital signal processing technique.

The above object of the present invention can be achieved by an FM demodulator, into which an FM signal is inputted, for demodulating the inputted FM signal and outputting a digital FM demodulated signal. The FM demodulator of the present invention is provided with: a limiter amplifier for amplifying and converting the inputted FM signal to a rectangular wave having a predetermined amplitude; a reference signal generator for generating a reference signal, which is a sine wave having a constant frequency; an A/D convertor for sampling the reference signal outputted from the reference signal generator by the rectangular wave outputted from the limiter amplifier to thereby output a digital signal; an orthogonalizing device for converting the digital signal outputted from the A/D convertor to two signals orthogonal to each other; an arctangent operator for calculating an arctangent value on the basis of a ratio of the two signals outputted from the orthogonalizing device; and a differentiation operator for calculating a differentiation of the arctangent value outputted from the arctangent operator, to thereby output the differentiation as the digital FM modulated signal.

According to the FM demodulator of the present invention, the FM signal inputted to the FM demodulator is amplified, is clipped by a constant level, and is converted into a rectangular wave having a predetermined amplitude, by the limiter amplifier. On the other hand, the sine wave having a constant frequency outputted from the reference signal generator is inputted as the reference signal into the A/D convertor, so that the A/D conversion is performed by using the rectangular wave from the limiter amplifier as the sampling pulse, to thereby output the digital signal. This digital signal is converted into two signals orthogonal to each other by the orthogonalizing device. The arctangent value is calculated on the basis of the ratio of these two signals by the arctangent operator. Then, the differentiation of the arctangent value is obtained by the differentiation operator. This calculated differentiation becomes the digital FM demodulated signal.

Accordingly, since the FM signal is converted into the rectangular wave, it is possible to stabilize the amplitude level without equipping the AGC circuit at the input or prior stage of the A/D convertor. By A/D-converting the sine wave having a constant frequency by using this rectangular wave as the sampling pulse, the digital signal including the FM modulation component is obtained. Thus, the processes at the later stage can be performed by using this digital signal. Therefore, the FM demodulator can be realized, in which the arctangent calculation is performed by the digital signal process, which can be miniaturized, which can have a high reliability, whose structure can be simplified, and whose cost can be reduced without employing the AGC or the like.

In one aspect of the FM demodulator of the present invention, the rectangular wave outputted from the limiter amplifier is used as a reference clock for the orthogonalizing device, the arctangent operator and the differentiation operator.

According to this aspect of the present invention, since it is sufficient for the block of the FM demodulator, where the digital signal process is performed, to operate when the FM signal is inputted, the sampling pulse obtained from the FM signal is used also as the reference clock for this block. Therefore, since the clock generation circuit or the like is not necessary, the structure of the FM demodulator can be even more simplified and the cost thereof can be even more reduced.

The nature, utility, and further features of this invention will be more clearly apparent from the following detailed description with respect to preferred embodiments of the invention when read in conjunction with the accompanying drawings briefly described below.

DETAILED DESCRIPTION OF THE PREFERRED EMBODIMENT

Referring to the accompanying drawings, an embodiment of the present invention will be now explained.

Figure 1:
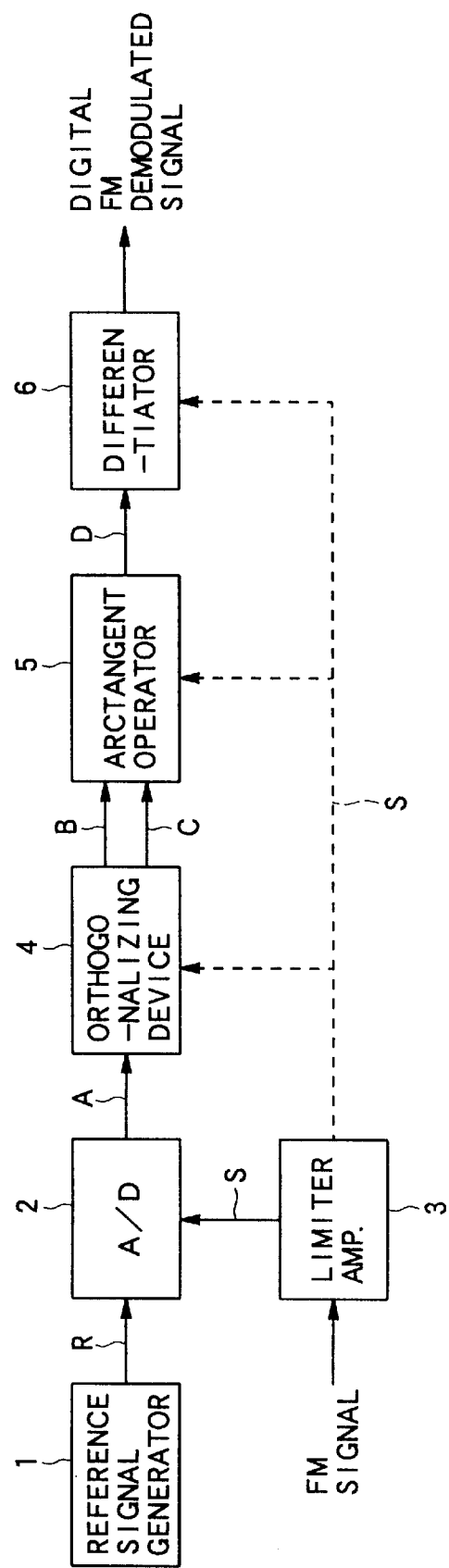
FIG. 1 is a block diagram of an arctangent type FM demodulator as an embodiment of the present invention.

FIG. 1 shows a structure of the arctangent type FM demodulator as the embodiment of the present invention. As shown in FIG. 1, the FM demodulator is provided with a reference signal generator 1, an A/D convertor 2, a limiter amplifier 3, an orthogonalizing device 4, an arctangent operator 5 and a differentiator 6.

In FIG. 1, the reference signal generator 1 generates a sine wave having a single frequency and a predetermined amplitude level, and outputs it as a reference signal R. This reference signal R is inputted to the A/D convertor 2, and is processed as described later. As the reference signal R, a tone signal having a frequency of 10 MHz may be employed, for example.

On the other hand, the FM signal inputted from an external device into the FM demodulator is actually inputted into the limiter amplifier 3. This limiter amplifier 3 amplifies the FM signal by a relatively large gain, and converts it into a rectangular wave by clipping it at a predetermined amplitude level. Namely, as the output of the limiter amplifier 3, a pulse signal, whose pulse width changes on a time axis in correspondence with a modulation component in the FM signal, is obtained and is used as a sampling pulse S for the A/D convertor 2 as described later.

Figure 2:
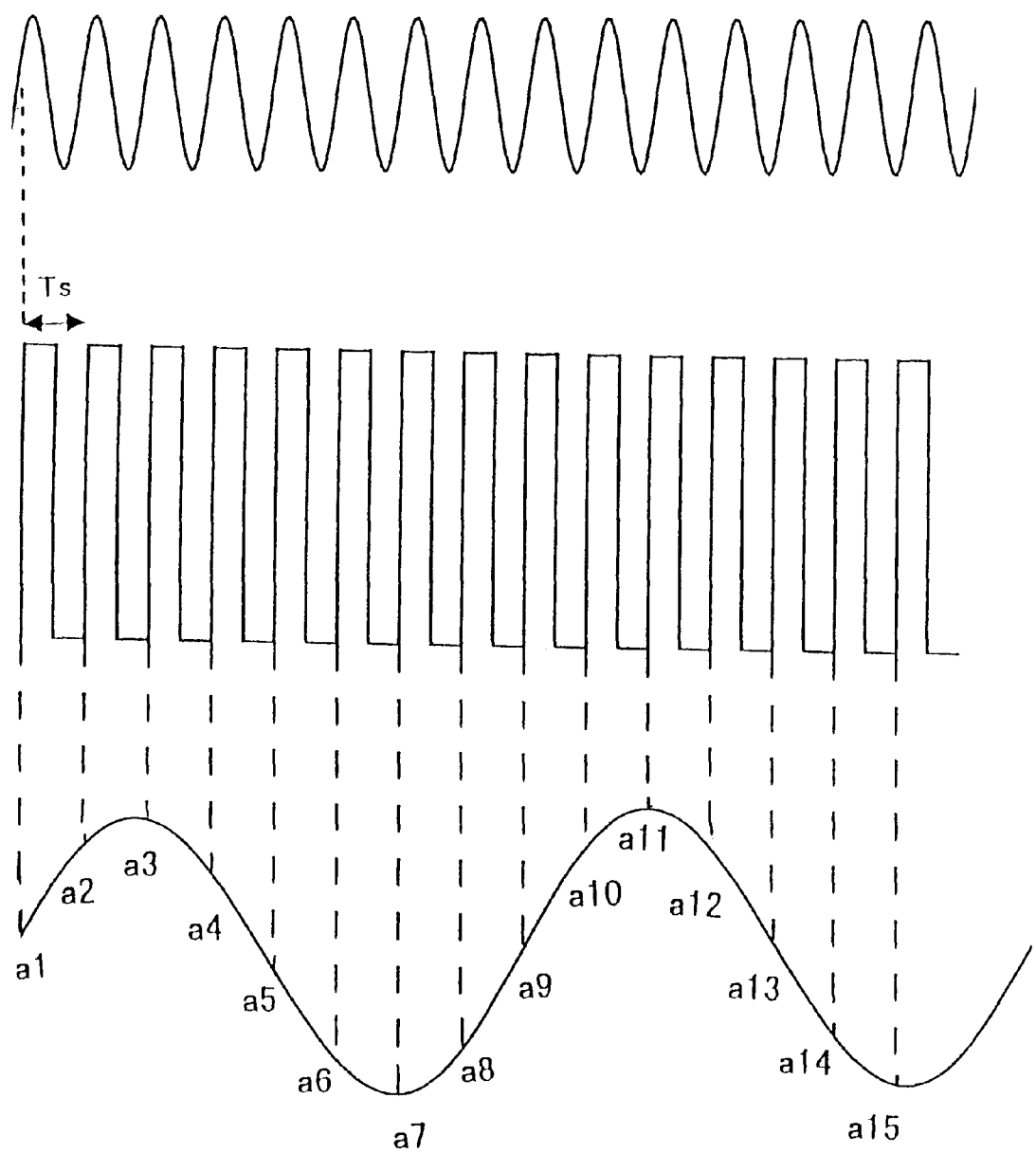
FIG. 2 is a timing chart showing respective waveforms in the arctangent type FM demodulator and the relationship between them in the embodiment.

The A/D convertor 2 samples the reference signal R in the analog form, which is outputted from the reference signal generator 1, and converts it into a digital signal A. At this time, the A/ID convertor 2 samples the reference signal R on the basis of the sampling pulse S obtained from the FM signal. Therefore, the reference signal R is digitized while the sampling timing is changes depending upon the modulation component in the FM signal, Here, the signal waveforms of the inputted FM signal, the reference signal R and the sampling pulse S and the relationships therebetween are explained with reference to FIG. 2. In FIG. 2, the respective waveforms of the FM signal, the reference signal R and the sampling signal S as well as the sampling timing of the A/D convertor 2 are illustrated. In the example shown in FIG. 2, it is assumed that the frequency of the FM signal is 80 MHz and the frequency of the reference signal R is 10 MHz.

In FIG. 2, a waveform (a) at a top stage is a waveform of the FM signal, which is inputted into the limiter amplifier 3. The waveform of the FM signal, which has a predetermined amplitude and has a frequency of 80 MHz, in the range of 15 cycles thereof is illustrated as the waveform (a). In fact, since the FM modulation has been applied to this FM signal, the cycle of the waveform changes on the time axis. However, this change is so small that the change cannot be recognized in the range of about several hundreds nsec (nano-seconds) in such a waveform (a) and the cycle is apparently constant.

In FIG. 2, a waveform (b) at a middle stage is a waveform of the sampling pulse S, which is obtained by converting the FM signal shown as the waveform (a) into the rectangular wave by the limiter amplifier 3. A rectangular wave having a duty ratio of 50% such that the upper half cycle is at a high amplitude level and the lower half cycle is at a low amplitude level with respect to the FM signal is illustrated as the waveform (b). Incidentally, the plus and minus of the waveform and the duty ratio may be appropriately set.

Since the amplitude of the FM signal drastically changes in orrespondence with the receiving condition, it is preferred to clip ven such a FM signal, whose amplitude is rather small, at a constant level, by setting the gain of the limiter amplifier 3 large so that the rectangular waveform can be obtained even from such a FM signal. By this, even if the FM signal having a wide amplitude range is inputted, it can be always converted to a precise rectangular wave, and the appropriate sampling pulse S can be obtained.

Further, although, in FIG. 2, the sampling pulse S is the rectangular wave having the cycle Ts as illustrated by the waveform (b), the cycle Ts also changes depending upon the FM modulation, which is applied to the FM signal as described above. The changing pattern of the cycle Ts depends on the modulation frequency and the modulation degree of the FM signal.

In FIG. 2, a waveform (c) at a bottom stage is a waveform of the reference signal R, which is outputted to the A/D convertor 2 from the reference signal generator 1. The waveform of the reference signal R, which has a constant amplitude and has a frequency of 10 MHz, is illustrated as the waveform (c). In the A/D convertor 2, the reference signal R is sampled on the basis of the above mentioned sampling pulse S. The waveform (c) of the reference signal R corresponds to a case that the reference signal R is sampled at a rising up timing of the sampling pulse S. In this case, sampling data corresponding to points a1 to a15 of the reference signal R as illustrated on the waveform (c) can be obtained, which becomes a digital signal A to be outputted to the orthogonalizing device 4.

As described above, since the cycle Ts of the sampling pulse changes in accordance with the FM modulation, the timing of sampling the reference signal R also changes in the same manner. Accordingly, in case of sampling the reference signal R, which has the constant frequency in fact, by the cycle Ts, the modulation component a having the cycle corresponding to the FM modulation is included in the outputted digital signal A. As a result, the FM modulation component remains in the signal, which is generated by the process of the arctangent FM demodulation at the later stage. Thus, it is possible to finally obtain the digital FM demodulated signal.

Incidentally, the respective signal waveforms and the relationships therebetween are not limited to those illustrated in FIG. 2. The frequency, the amplitude level and the like can be appropriately set within the range that the A/D convertor 2 can perform the A/D conversion.

In FIG. 1 again, the orthogonalizing device 4 generates two signals orthogonal to each other i.e., a digital signal B and a digital signal C, on the basis of the digital signal A outputted from the A/D convertor 2. The phase of the digital signal B is in advance of that of the digital signal C by 90 degrees.

More concretely, the orthogonalizing device 4 branches the inputted digital signal A into 2 two, and phase-shifts one of them by 90 degrees by use of a phase-shifter therein while correcting just the delay time of the phase-shifter for another of them, to thereby generate the digital signal B and the digital signal C orthogonal to each other. As such a phase-shifter, it is possible to employ a Hilbert convertor, for example.

The arctangent operator 5 calculates an angular signal D which satisfies a following expression with respect to the digital signal B and the digital signal C outputted from the orthogonalizing device 4.

$$\tan^{-1}(C/B)=D$$

This angular signal D corresponds to an arctangent value for the digital signal B and the digital signal C orthogonal to each other.

This arctangent operator 5 may be constructed by using a divider and a ROM table storing the arctangent value data. Alternatively, the calculating process may be performed without using such a ROM table.

The differentiator 6 performs a calculation by means of a differential approximation so as to obtain a differentiation of the angular signal D outputted from the arctangent operator 5. Namely, the differentiator 6 obtains a delayed angular signal D', which is delayed by a predetermined time period with respect to the angular signal D, and performs a subtraction between the angular signal D and the delayed angular signal D'. Additionally, this point is confirmed experimentally. By restituting this digital FM demodulated signal to an analog signal by equipping a D/A convertor at a later stage, an audio sound signal can be obtained, for example.

Incidentally, it is sufficient for the orthogonalizing device 4, the arc-tangent operator 5 and the differentiator 6, where the digital signal process is performed, to operate in case that the FM signal is inputted. Thus, the sampling pulse S may be used as the reference clock supplied to the orthogonalizing device 4, the arc-tangent operator 5 and the differentiator 6 (as indicated by a dashed line in FIG. 1). In this case, since it is not necessary to separately generate a reference clock exclusive for the digital signal process, it is possible to reduce the cost.

As described above, according to the present embodiment, the FM signal is converted into the rectangular wave by the limiter amplifier 3 and is used as the sampling pulse for the A/D convertor 2, while the reference signal R having a constant frequency is inputted into the A/D convertor 2, so as to convert it to the digital data by sampling it by the sampling pulse S. After that, on the basis of the action of the orthogonalizing device 4, the arctangent operator 5 and the differentiator 6, the digital FM demodulated signal can be finally obtained. Therefore, although the amplitude of the FM signal changes or fluctuates in correspondence with the receiving condition, it is not necessary to equip the AGC amplifier at the input or prior stage of the A/D convertor. Consequently, the arctangent type FM demodulator, whose structure is rather simple and whose cost is reduced, can be realized.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 11-165415 on Jun. 11, 1999 including the specification, claims, and summary is incorporated herein by reference in its entirety.

What is claimed is:

1. An FM demodulator, into which an FM signal is inputted, for demodulating the inputted FM signal and outputting a digital FM demodulated signal, said FM demodulator comprising:

a limiter amplifier for amplifying and converting the inputted FM signal to a rectangular wave having a predetermined amplitude;

a reference signal generator for generating a reference signal, which is a sine wave having a constant frequency;

an A/D convertor for sampling the reference signal outputted from said reference signal generator by the rectangular wave outputted from said limiter amplifier to thereby output a digital signal;

an orthogonalizing device for converting the digital signal outputted from said A/D convertor to two signals orthogonal to each other;

an arctangent operator for calculating an arctangent value on the basis of a ratio of the two signals outputted from said orthogonalizing device; and a differentiation operator for calculating a differentiation of the arctangent value outputted from said arctangent operator, to thereby output the differentiation as the digital FM modulated signal.

2. An FM demodulator according to claim 1, wherein the rectangular wave outputted from said limiter amplifier is used as a reference clock for said orthogonalizing device, said arctangent operator and said differentiation operator.

* * * * *